United States Patent
Maier

(10) Patent No.: US 11,970,077 B2
(45) Date of Patent: Apr. 30, 2024

(54) METHOD FOR DETERMINING AN ELECTRICAL CELL VOLTAGE OF A BATTERY CELL OF A TRACTION BATTERY OF A VEHICLE, AND DEVICE

(71) Applicant: Daimler AG, Stuttgart (DE)

(72) Inventor: Andreas Maier, Uhingen (DE)

(73) Assignee: Daimler AG, Stuttgart (DE)

( * ) Notice: Subject to any disclaimer, the term of this patent is extended or adjusted under 35 U.S.C. 154(b) by 302 days.

(21) Appl. No.: 17/599,526

(22) PCT Filed: Feb. 11, 2020

(86) PCT No.: PCT/EP2020/053488
§ 371 (c)(1),
(2) Date: Sep. 28, 2021

(87) PCT Pub. No.: WO2020/200558
PCT Pub. Date: Oct. 8, 2020

(65) Prior Publication Data
US 2022/0144129 A1    May 12, 2022

(30) Foreign Application Priority Data
Mar. 29, 2019   (DE) .................... 10 2019 002 309.9

(51) Int. Cl.
*B60L 58/12*     (2019.01)
*G01R 31/3835*   (2019.01)
*G01R 31/396*    (2019.01)

(52) U.S. Cl.
CPC .......... *B60L 58/12* (2019.02); *G01R 31/3835* (2019.01); *G01R 31/396* (2019.01)

(58) Field of Classification Search
None
See application file for complete search history.

(56) References Cited

U.S. PATENT DOCUMENTS

2009/0224771 A1* 9/2009 Deveau ................ G01R 31/389
                                                     324/600
2014/0266224 A1  9/2014 Bush et al.
(Continued)

FOREIGN PATENT DOCUMENTS

| CN | 101034815 A | 9/2007 |
| CN | 201698011 U | 1/2011 |

(Continued)

OTHER PUBLICATIONS

PCT/EP2020/053488, International Search Report dated May 15, 2020 (Two (2) pages).
(Continued)

*Primary Examiner* — Jas A Sanghera
(74) *Attorney, Agent, or Firm* — Crowell & Moring LLP

(57) ABSTRACT

A method for determining a cell voltage of a battery cell of a traction battery of a vehicle includes filtering the cell voltage of the battery cell by a filtering device, sampling the filtered cell voltage by an analogue to digital converter, transferring the filtered and sampled cell voltage as a cell voltage signal to a computing device, evaluating the cell voltage signal by the computing device, determining a ripple value which describes a ripple of the cell voltage, and evaluating the cell voltage signal depending on the ripple value.

4 Claims, 1 Drawing Sheet

(56) References Cited

U.S. PATENT DOCUMENTS

2017/0038434 A1 2/2017 Asakura et al.
2020/0365951 A1* 11/2020 Yamamoto ................ H02J 7/02

FOREIGN PATENT DOCUMENTS

| | | |
|---|---|---|
| CN | 102822690 A | 12/2012 |
| CN | 105452882 A | 3/2016 |
| DE | 103 09 913 B3 | 8/2004 |
| EP | 1 798 838 A2 | 6/2007 |
| EP | 3 037 830 A1 | 6/2016 |
| JP | 2014-110728 A | 6/2014 |
| WO | WO 2010/081746 A2 | 7/2010 |
| WO | WO 2011/043311 A1 | 4/2011 |

OTHER PUBLICATIONS

Chinese-language Chinese Office Action issued in Chinese Application No. 202080022984.7 dated Aug. 19, 2023, with partial English translation (13 pages).

* cited by examiner

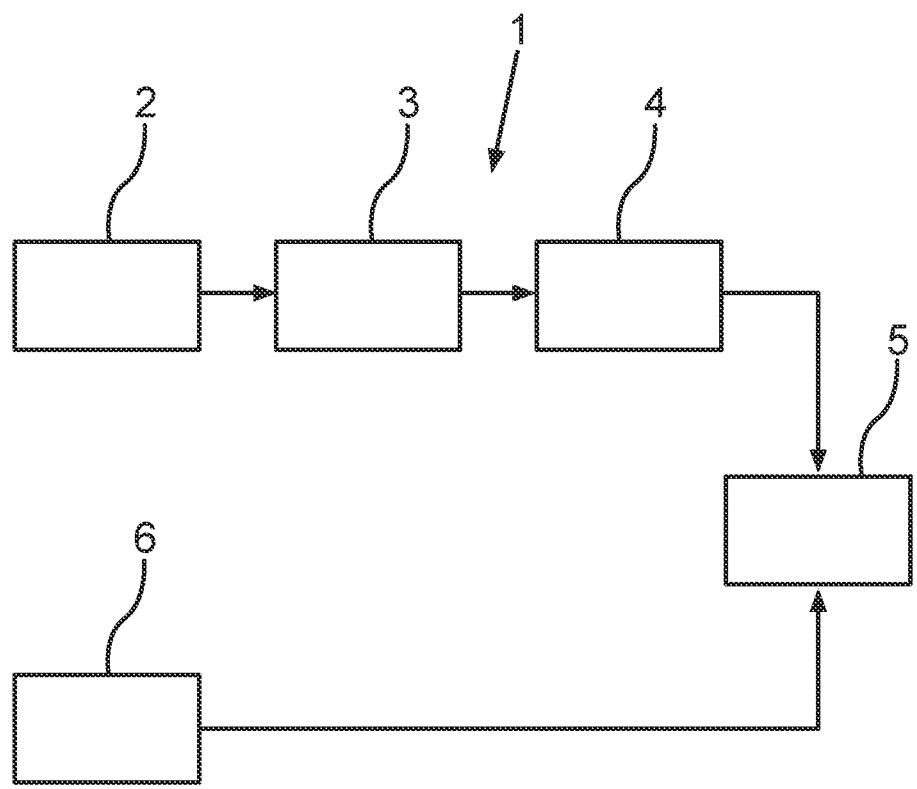

METHOD FOR DETERMINING AN ELECTRICAL CELL VOLTAGE OF A BATTERY CELL OF A TRACTION BATTERY OF A VEHICLE, AND DEVICE

BACKGROUND AND SUMMARY OF THE INVENTION

The invention relates to a method for determining an electrical cell voltage of a battery cell of a traction battery of a vehicle, in which the cell voltage of the battery cell is filtered by a filter device for providing a cell voltage signal, which describes the cell voltage of the battery cell, and the filtered cell voltage is sampled by an analogue to digital converter, wherein the cell voltage signal is evaluated. Furthermore, the invention relates to a device for determining an electrical cell voltage of a battery cell of a traction battery of a vehicle.

Various methods for determining the cell voltage of a battery cell are known from the prior art. The detection of the cell voltage of each individual battery cell of a traction battery of a vehicle is required in order to monitor the operation of the battery cell, for example, and/or to control the charging process of the battery. In order that the cell voltage of a battery cell can be detected and correspondingly evaluated, it is necessary to digitize the cell voltage or to sample this. In addition, it is known from the prior art that a corresponding filtering or filtration of the cell voltage or the cell voltage measurements is carried out by a deep-pass filter. In doing so, the corner frequency of the deep-pass filter is chosen in such a way that it lies below half the sampling rate of the measuring signal, so that the Nyquist-Shannon sampling theorem is satisfied.

In addition, other approaches are known in which it is assumed that the corresponding frequency shares in the spectrum do not have any relevant amplitude and thus aliasing does not occur. Yet, when charging the battery on a DC charging column, such an approach cannot be used since the corresponding norm allows a voltage ripple in the relevant frequency range.

A further option constitutes oversampling and subsequent digital filtering. In order to provide safe measurements using these methods, it is necessary for each cell voltage to be extensively digitized. Thus, one analogue to digital converter per cell channel or per battery cell is necessary, since multiplexing several cell voltages is not possible using one analogue to digital converter.

In this context, US 2017/0038434 A1 describes a device for supplying power, which comprises a battery having a plurality of battery cells, a plurality of measuring lines, a filtering switch and an analogue to digital converter. The filtering switch is constructed from input ports, output ports, filter resistors and filter capacitors, one end of which is respectively switched between the filter resistors and the output ports and the other ends are jointly connected to one another.

The object of the present invention is to demonstrate a solution as to how the determination of the cell voltage of a battery cell of a traction battery can be carried out cost-effectively and safely.

According to the invention, this object is solved by a method and by a device having the features according to the independent claims. Advantageous developments of the invention are specified in the dependent claims.

A method according to the invention serves to determine an electrical cell voltage of a battery cell of a traction battery of a vehicle. In the method, the cell voltage of the battery cells is filtered by a filtering device for providing a cell voltage signal, which describes the cell voltage of the battery cell, and the filtered cell voltage is sampled by an analogue to digital converter, wherein the cell voltage signal is evaluated. Here, it is provided that a ripple value is additionally provided, which describes a ripple of the cell voltage. Furthermore, the cell voltage signal is evaluated depending on the ripple value.

The electrical cell voltage of the battery cell can be determined and evaluated by means of the method. The battery cell is part of the traction battery, wherein the traction battery comprises a plurality of battery cells, which are electrically switched in a row and/or in parallel. The method can be carried out for each of the battery cells. The traction battery can serve, in particular, to supply a drive engine of an electric vehicle or a hybrid vehicle with electrical energy. In order to be able to evaluate the cell voltage of the battery cell, the cell voltage signal is provided. For this purpose, the electrical cell voltage, which can be measured, for example, with a corresponding first sensor as the analogue signal, is filtered. A corresponding filtering device or a deep-pass filter can be used to filter the cell voltage. Here, the cell voltage can be filtered with a relatively high corner frequency, for example with a corner frequency of 1 kHz. Following on from this, the filtered cell voltage can be sampled by the analogue to digital converter. For example, the sampling can be carried out with a sampling rate of 100 Hz. Here, distortions by aliasing effects can be accepted.

According to an essential aspect of the present invention, it is provided that the ripple value is provided by a second sensor. In principle, an electrical voltage can also be detected by the second sensor and the ripple value can be derived from this. This ripple value describes the voltage ripple of the cell voltage in the relevant frequency range, in particular in a frequency range of between 50 Hz and 2 kHz, with a high bandwidth. Here, the voltage ripple can firstly be determined for the total voltage provided by the traction battery and then scaled to the cell level. The ripple value is a measure for the maximum aliasing-induced measuring deviation, which is to be taken into consideration on the cell level. This ripple value is taken into consideration by the computing device when evaluating the cell voltage signal. In other words, the evaluation of the cell voltage signal is carried out on the basis of the ripple value.

Using the method, it is possible that anti-aliasing measures can be carried out at a central point. Thus, costly and large deep-pass filters at the cell level can be dispensed with. In addition, a safe determination of the maximum cell voltage is possible independent of the present voltage ripple. If no high disruption amplitudes are present, the power and the availability of the battery are not reduced in comparison to the status quo.

A device according to the invention for determining an electrical cell voltage of a battery cell of a traction battery of a vehicle comprises a first sensor for detecting the cell voltage. In addition, the device comprises a filtering device for filtering the cell voltage. Furthermore, the device comprises an analogue to digital converter for sampling the filtered cell voltage and for emitting the filtered and sampled cell voltage as a cell voltage signal. Moreover, the device comprises a computing device for evaluating the cell voltage signal. Furthermore, it is provided that the device has a second sensor for providing a ripple value, wherein the ripple value describes a ripple of the cell voltage. Furthermore, the computing device is formed to evaluate the cell voltage signal depending on the ripple value.

The preferred embodiments presented in relation to the method according to the invention and the advantages thereof apply correspondingly to the device according to the invention.

Further advantages, features and details of the invention emerge from the description below of a preferred exemplary embodiment and by means of the drawing. The features and feature combinations mentioned above in the description as well as the features and feature combinations mentioned below in the description of the figures and/or shown on their own in the single FIGURE can be used not only in the respectively specified combination, but also in other combinations or on their own, without leaving the scope of the invention.

BRIEF DESCRIPTION OF THE DRAWING

The single FIGURE shows a schematic depiction of a device for determining a cell voltage of a battery cell of a traction battery of a vehicle.

DETAILED DESCRIPTION OF THE DRAWING

The device 1 for determining a cell voltage of a battery cell of a traction battery of a vehicle can be arranged in the vehicle, for example, and can detect the respective cell voltages during operation of the vehicle or during a charging process of the vehicle. The device 1 comprises a first sensor 2, by means of which the cell voltage of a battery cell can be detected. The first sensor can be formed as a voltage sensor. In the present, simplified depiction, the device 1 comprises a first sensor 2 by way of example. It can also be provided that the device 1 has a plurality of first sensors 2. For example, the device 1 can have a first sensor 2 for each of the battery cells.

Moreover, the device 1 comprises a filtering device 3, by means of which the cell voltage can be filtered in an analogue manner. The filtering device 3 can be formed as a deep pass filter and can have a corner frequency of between 500 Hz and 1.5 kHz, preferably 1 kHz. Furthermore, the device 1 comprises an analogue to digital converter 4. The filtered cell voltage can be digitized or sampled using this analogue to digital converter 4. The digitization can be carried out with a sampling rate of between 50 Hz and 200 Hz, preferably with a sampling rate of 100 Hz. Here, distortions by aliasing effects are accepted. The filtered and sampled cell voltage is transferred as a cell voltage signal to a computing device 5 of the device 1. The cell voltage signal can be evaluated by means of the computing device 5.

Moreover, the device 1 comprises a second sensor 6, which is also formed as a voltage sensor. By means of the second sensor 6, a voltage ripple of the cell voltage in a relevant frequency range, in particular in a frequency range of between 50 Hz and 2 kHz, can be detected. In doing so, it is provided, in particular, that an electrical total voltage of the traction battery is detected by means of the second sensor 6 and the voltage ripple is determined from this. The voltage ripple describes, in particular, the difference between a minimum value and a maximum value of the battery voltage measurement. This voltage ripple is a measure for the maximum aliasing-induced measuring deviation which is to be taken into consideration on the cell level.

In addition, it is provided, in particular, that the voltage ripple is scaled to the cell level for determining the ripple value. For example, the voltage ripple can be divided by the number of the battery cells switched in series and can then be added to the (measured) maximum cell voltage measurements. The determination of the ripple value can be carried out by means of the computing device 5. It can also be provided that an additional device is provided for determining the ripple value. Based on the ripple value, the voltage signal can then be evaluated by means of the computing device 5.

Anti-aliasing measures can also be carried out at a central point by means of the device 1, whereby costly and large deep-pass filters on the cell level can be omitted.

LIST OF REFERENCE CHARACTERS

1 Device
2 First sensor
3 Filtering device
4 Analogue to digital converter
5 Computing device
6 Second sensor

What is claimed is:

1. A method for determining a cell voltage of a battery cell of a traction battery of a vehicle, comprising the steps of:
   detecting the cell voltage of the battery cell by a first sensor;
   filtering the detected cell voltage of the battery cell by a filtering device;
   sampling the filtered cell voltage by an analogue to digital converter;
   transferring the filtered and sampled cell voltage as a cell voltage signal to a computing device;
   evaluating the cell voltage signal by the computing device;
   determining a total voltage of the traction battery by a second sensor; and
   evaluating the cell voltage signal depending on the ripple value;
   wherein a voltage ripple of the total voltage is determined and wherein the voltage ripple of the total voltage is scaled for the battery cell by dividing the voltage ripple of the total voltage by a number of battery cells switched in series to obtain a result and then adding the result to a detected maximum cell voltage of the battery cell.

2. The method according to claim 1, wherein the voltage ripple of the total voltage is determined in a frequency range of between 50 Hz and 2 kHz.

3. The method according to claim 1, wherein the cell voltage is filtered by a deep-pass filter with a corner frequency of between 500 Hz and 1.5 kHz and wherein the filtered cell voltage is sampled with a sampling rate of between 50 Hz and 200 Hz.

4. A device for determining a cell voltage of a battery cell of a traction battery of a vehicle, comprising:
   a first sensor, wherein the first sensor detects the cell voltage;
   a filtering device, wherein the filtering device filters the detected cell voltage;
   an analogue to digital converter, wherein the analogue to digital converter samples the filtered cell voltage and transfers the filtered and sampled cell voltage as a cell voltage signal to a computing device;
   wherein the computing device evaluates the cell voltage signal; and
   a second sensor, wherein the second sensor determines a total voltage of the traction battery;
   wherein the computing device evaluates the cell voltage signal depending on the ripple value;

wherein a voltage ripple of the total voltage is determined and wherein the voltage ripple of the total voltage is scaled for the battery cell by dividing the voltage ripple of the total voltage by a number of battery cells switched in series to obtain a result and then adding the result to a detected maximum cell voltage of the battery cell.

* * * * *